United States Patent
Lee et al.

(10) Patent No.: US 6,707,322 B2
(45) Date of Patent: Mar. 16, 2004

(54) TRANSCONDUCTOR HAVING STRUCTURE OF CROSSING PAIRS

(75) Inventors: Jeong-won Lee, Sungnam (KR); Gea-ok Cho, Yongin (KR); Jung-eun Lee, Seoul (KR)

(73) Assignee: Samsung Electronics Co., Ltd., Gyunggi-do (KR)

(*) Notice: Subject to any disclaimer, the term of this patent is extended or adjusted under 35 U.S.C. 154(b) by 0 days.

(21) Appl. No.: 10/359,252

(22) Filed: Feb. 6, 2003

(65) Prior Publication Data

US 2003/0169080 A1 Sep. 11, 2003

(30) Foreign Application Priority Data

Mar. 7, 2002 (KR) .................................. 2002-12222

(51) Int. Cl.[7] .............................................. H02M 11/00
(52) U.S. Cl. ........................ 327/103; 327/432; 327/435
(58) Field of Search ................................. 327/103, 427, 327/432, 435, 560; 323/280, 315; 330/252

(56) References Cited

U.S. PATENT DOCUMENTS

| | | | |
|---|---|---|---|
| 5,552,730 A | * | 9/1996 | Deguchi .................... 327/103 |
| 6,278,299 B1 | * | 8/2001 | Madni et al. ............... 327/103 |
| 6,369,618 B1 | * | 4/2002 | Bloodworth et al. ....... 327/103 |
| 6,577,170 B1 | * | 6/2003 | Prodanov .................... 327/103 |
| 6,639,457 B1 | * | 10/2003 | Lou ............................. 327/560 |

* cited by examiner

Primary Examiner—My-Trang Nu Ton
Assistant Examiner—Hiep Nguyen
(74) Attorney, Agent, or Firm—Sughrue Mion, PLLC

(57) ABSTRACT

A transconductor for generating a current corresponding to an input voltage. The transconductor has a crossing pairs structure. The transconductor comprises a first and a second MOS (Metal-Oxide Semiconductor) transistors mutually connected in series to a voltage source. A first bipolar transistor is connected to a current source. A collector terminal of the first bipolar terminal is connected to an output current terminal. An emitter terminal of the first bipolar terminal is connected to a gate terminal of the second MOS transistor. A second bipolar transistor is connected in series to the first bipolar transistor. A base terminal of the second bipolar transistor is connected to a node between the first MOS transistor and the second MOS transistor. A third MOS transistor is provided. A gate terminal of the third MOS transistor is connected to an input terminal for a signal from outside. A drain terminal of the third MOS transistor is connected to an emitter terminal of the second bipolar transistor.

3 Claims, 6 Drawing Sheets

TRANSCONDUCTOR HAVING STRUCTURE OF CROSSING PAIRS

BACKGROUND

This Application claims priority from Korean Patent Application No. 2002-12222, the contents of which are incorporated herein by reference.

1. Field

This disclosure teaches techniques related to a transconductor. Specifically, techniques related to a transconductor capable of extending an input signal restriction range for securing stability of an element are taught.

2. Background of the Related Art

A transconductor is used for outputting a current signal corresponding to an input signal size. In performing this function, the transconductor forms a basic circuit element for circuits like a variable amplifier, a filter, etc.

A variety of such transconductors are known. Some of which are disclosed herein. A paper titled "A 20-MHz sixth-order BiCMOS parasitic insensitive continuous-time filter and second-order equalizer optimized for disc-drive read channels", IEEE J, Solid-State Circuits, vol.28, pp.462–470, April.1993, discloses a transconductor using a BiCMOS element.

A conventional circuit for a transconductor disclosed in the above paper, is illustrated in FIG. 1. In the transconductor illustrated in FIG. 1, a drain-source voltage of a MOS (Metal-Oxide Semiconductor) transistor M1 is operated together with a control voltage(Vc) so that a constant voltage may be maintained, thereby achieving transconductance.

In the transconductor circuit with the structure shown in FIG. 1, however, a current flowing through a base of a bipolar transistor Q2 changes depending on a size of an input signal Vi. A base-emitter voltage of the bipolar transistor Q2 is changed accordingly. This results in a drain-source voltage of the MOS transistor M1 also being changed. A disadvantage in such a situation is that the transconductance is not maintained a constant.

Another paper by WYSZYNSKI, A, titled "low voltage CMOS and BiCMOS triode transconductors and integrators with gain-enhanced linearity and output impedance", Electron. Lett., 1994, 30, pp211–213, discloses a conventional transconductor circuit, which is illustrated in FIG. 2.

A transconductor circuit as shown in FIG. 2 employs a feedback structure using an OP amp.(Operational Amplifier). However, because of the OP amp. used for this transconductor circuit, a substantial amount of power is dissipated. Further, in such a structure, a drain voltage cannot be made lower than a threshold voltage due to common-mode range(CMR) restrictions. Therefore, a disadvantage in such a structure is that the variable range for the transconductor will be restricted. Further, another disadvantage is that the feedback structure is not adequate for high frequency use, at least because, a low frequency pole is generated.

Another paper by P. Likittanapong, A. Worapshet and C. Toumazou, titled "Linear CMOS triode transconductor for low voltage applications", Electronics Letters, Jun. 11, 1998, vol. 34, No.12, discloses yet another conventional transconductor that also employs a feedback structure without using an OP amp. This is illustrated in FIG. 3.

However, the transconductor shown in FIG. 3 is disadvantageous at least because it is not adequate for a circuit intended for high frequency use. This again is at least because a low frequency pole is generated.

Still another conventional transconductor is disclosed in a paper by Fuji Yang, Christian C., titled "A Low-Distortion BiCMOS Seventh-Order Bessel Filter Operationg at 2.5V Supply", IEEE J. Solid-State Circuits, vol. 31, No. 3, March 1996. This transconductor employs a structure involving crossing pairs, which is illustrated in FIG. 4.

A transconductor shown in FIG. 4 is capable of maintaining a drain voltage of a MOS transistor M1 at a constant. Since this structure does not use a feedback, it can be used under high frequency conditions. A base-emitter voltage VBE4 of a bipolar transistor Q4, in FIG. 4, can be obtained by the following formula.

$$V_{BE4}=Vref-V_{BE1} \quad \text{[Formula 1]}$$

Here, $V_{BE1}$ is a base-emitter voltage of a bipolar transistor Q1.

As can be seen from formula 1, a base-emitter voltage VBE4 of the bipolar transistor Q4, whose emitter terminal is connected to the ground, varies depending on a bias voltage applied to the Vref. Therefore, if a high voltage, for example, a voltage more than 1.5V is applied to the Vref, an excessive current flows to the bipolar transistor Q4. Because of such an excessive current an element could be destroyed. Therefore, a disadvantage of such a structure as shown in FIG. 4 is that it can be used only with low voltages.

As can be seen from the above discussions, a transconductor capable of operating even in high voltage condition, having a wide range of operation frequency while maintaining linearity is required.

The teachings of the present disclosure are aimed at overcoming some of the disadvantages noted in relation to conventional techniques.

SUMMARY

To overcome the disadvanteages noted above there is provided a transconductor for generating a current corresponding to an input voltage. The transconductor has a crossing pairs structure. The transconductor comprises a first and a second MOS(Metal-Oxide Semiconductor) transistors mutually connected in series to a voltage source. A first bipolar transistor is connected to a current source. A collector terminal of the first bipolar terminal is connected to an output current terminal. An emitter terminal of the first bipolar terminal is connected to a gate terminal of the second MOS transistor. A second bipolar transistor is connected in series to the first bipolar transistor. A base terminal of the second bipolar transistor is connected to a node between the first MOS transistor and the second MOS transistor. A third MOS transistor is provided. A gate terminal of the third MOS transistor is connected to an input terminal for a signal from outside. A drain terminal of the third MOS transistor is connected to an emitter terminal of the second bipolar transistor.

In a specific improvement the transconductor further includes a reference bias voltage source provided to a base terminal of the first bipolar transistor; and a control voltage source applied to a base terminal of the first MOS transistor for adjusting transconductance.

More specifically, the control voltage source is preferably configured such that a voltage whose value is a sum of a voltage intended for being maintained between a gate and a source of the third MOS transistor and the reference bias voltage sources, is applied to a base terminal of the first MOS transistor.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION

Figure 1:
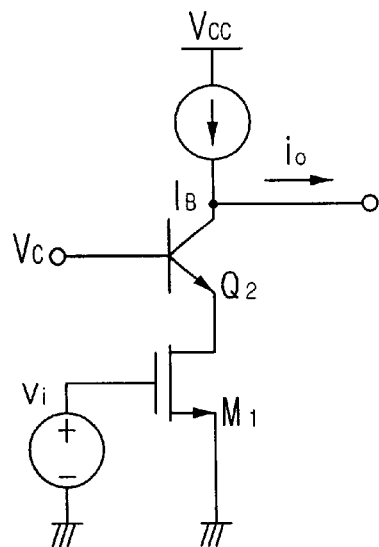
FIG. 1 is a circuit diagram representing a first example of a conventional transconductor circuit.
Figure 2:
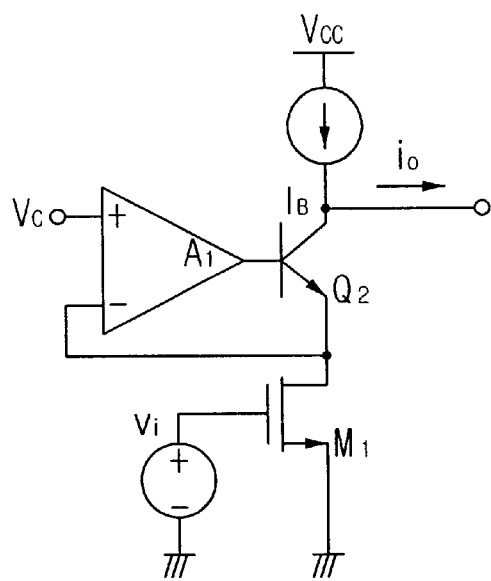
FIG. 2 is a circuit diagram representing a second example of a conventional transconductor.
Figure 3:
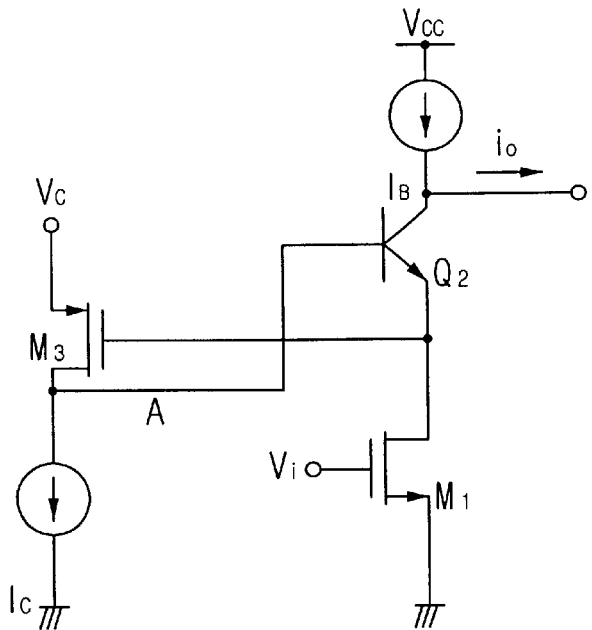
FIG. 3 is a circuit diagram representing a third example of a conventional transconductor.
Figure 4:
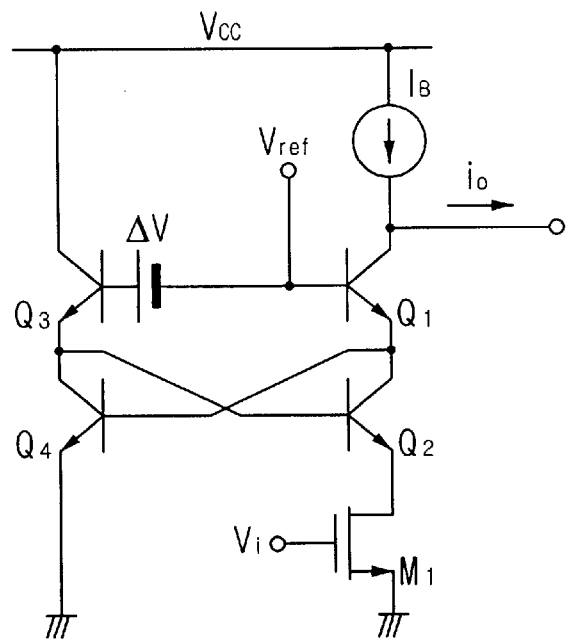
FIG. 4 is a circuit diagram representing a fourth example of a conventional transconductor circuit.
Figure 5:
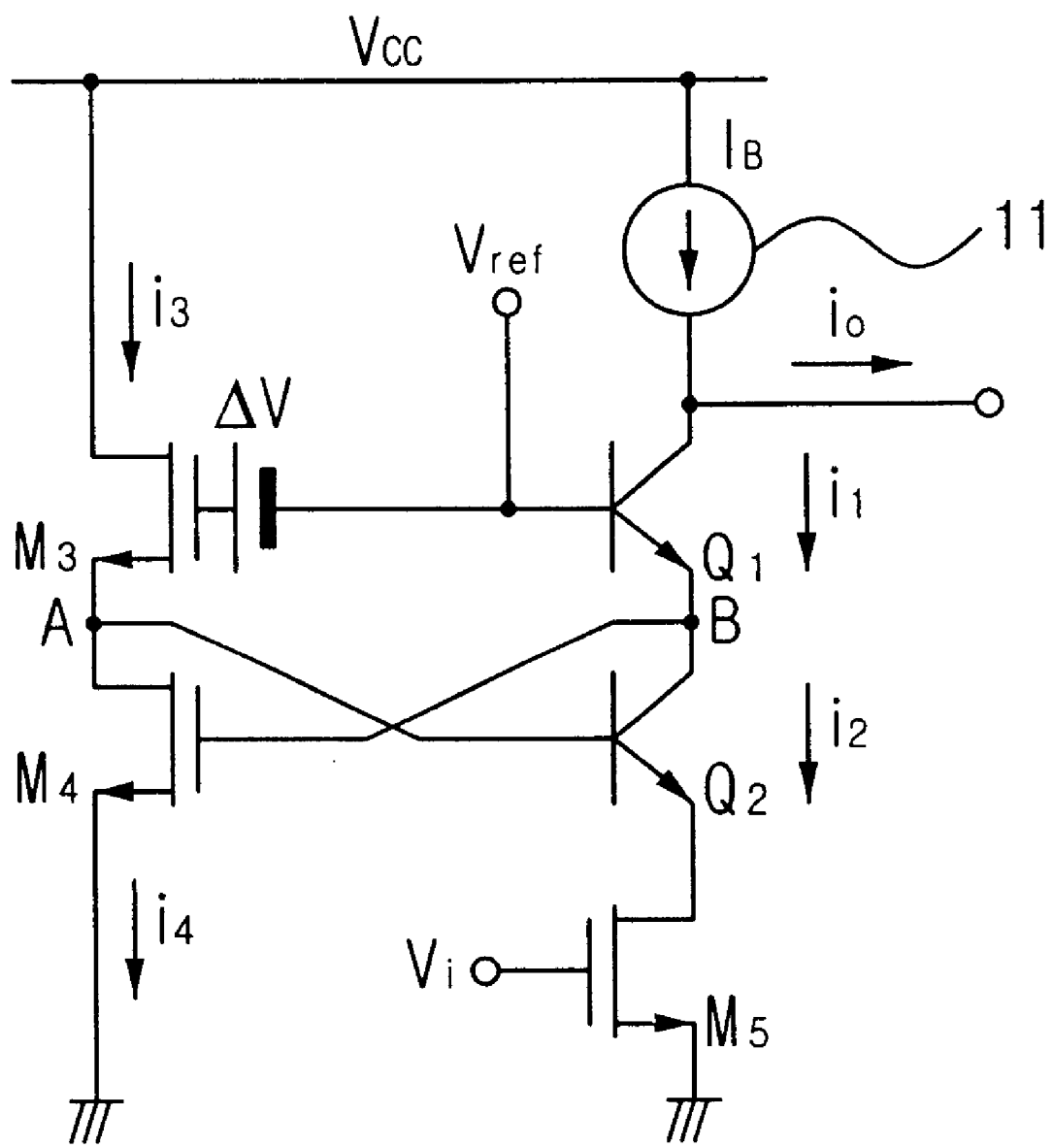
FIG. 5 is a circuit diagram representing an example of a transconductor embodying the teachings of the present disclosure.

The following detailed description will present an example of a transconductor embodying the teachings of this disclosure. The structure disclosed, involving crossing pairs, is described with reference to the accompanying drawings. FIG. 5 is a circuit diagram representing such a transconductor embodying the disclsoed teachings.

The exemplary transconductor, shown in FIG. 5, includes a first MOS transistor M3, a second MOS transistor M4 mutually connected in series through a drain and a source terminals. The transistors M3 and M4 are positioned between a provided power supply Vcc, a voltage source $\Delta V$ and a ground.

Also, a first bipolar transistor Q1 and a second bipolar transistor Q2 are connected in series to a current source 11 connected to the provided power supply Vcc, and a third MOS transistor M5 is connected to an emitter terminal of the second bipolar transistor Q2.

The first MOS transistor M3 and the second MOS transistor M4 are mutually connected to a first node A. The first node A, in turn, is connected to a base terminal of the second bipolar transistor Q2. The first bipolar transistor Q1 and the second bipolar transistor Q2 are mutually connected to a second node B. The second node B is connected to a gate terminal of the second MOS transistor M4.

A reference bias voltage Vref is applied to the base terminal of the first bipolar transistor Q1. A control voltage source Vref+$\Delta V$ is connected to a gate of the first MOS transistor M3 for adjusting transconductance for determining a drain-source voltage of the third MOS transistor M5. The voltage difference $\Delta V$, between the control voltage source applied to the gate of the first MOS transistor M3 and the reference voltage applied to the base terminal of the first bipolar transistor Q1, determines a drain-source voltage of the third MOS transistor M5.

In such a transconductor having a crossing pairs structure, a gate-source voltage of the third MOS transistor M5 is maintained constant by a potential corresponding to the voltage difference $\Delta V$ regardless of a size of an input voltage Vi.

Namely, a change in an output current Io corresponding to a change in an input signal Vi provided to a gate of the third MOS transistor M5, has an influence on an emitter of the first bipolar transistor Q1 and a gate of the second MOS transistor M3, whereby a source current of the first MOS transistor M3 is changed. Resultantly, a changed source voltage of the first MOS transistor M3 is applied to the second bipolar transistor Q2, whereby a change in a drain voltage of the third MOS transistor M5 is suppressed.

Here, a drain-source voltage VDS5 of the third MOS transistor M5 could be obtained by the following formula.

$$V_{DS5} = \Delta V + V_{BE1} + V_{GS4} - (V_{GS3} + V_{BE2}) \quad \text{[Formula 2]}$$

A Change $\Delta_{DS5}$ of a drain-source voltage $V_{DS5}$ according to an input signal Vi could be obtained by the following formula.

$$\Delta V_{DS5} = \Delta V_{BE1} + \Delta V_{GS4} - (\Delta V_{GS3} + \Delta V_{BE2}) \quad \text{[Formula 3]}$$

In the above formula 3, a condition where $\Delta V_{DS5}$ becomes zero($\Delta V_{DS5}=0$), could be obtained when the following conditions are satisfied.

$$\Delta V_{BE1} = \Delta V_{BE2}$$

$$\Delta V_{GS3} = \Delta V_{GS4} \quad \text{[Formula 4]}$$

If a base current of the bipolar transistor and a channel length modulation factor of the MOS transistor are ignored, then a base-emitter voltage change $\Delta V_{BE}$ and a gate-source voltage change $\Delta V_{GS}$ could be represented in terms of two different collector currents $i_C$, $i_C'$ and two different drain currents $i_D$, $i_D'$ as follows.

[Formula 5]

$$\Delta V_{BE} = V_T \ln\left(\frac{i_{C'}}{i_S}\right) - V_T \ln\left(\frac{i_C}{i_S}\right) = V_T \ln\left(\frac{I_{C'}}{i_S}\right)$$

[Formula 6]

$$\Delta V_{GS} = \sqrt{\frac{i_{D'}}{k}} + V_{TH} - \left(\sqrt{\frac{i_D}{k}} + V_{TH}\right) = \frac{1}{\sqrt{k}}\left(\sqrt{i_{D'}} - \sqrt{i_D}\right)$$

Here, $i_S$ represents a saturation current, $i_C$ and $i_C'$ represent collector currents of a bipolar transistor, $i_D$ and $i_D'$ represent drain currents of a MOS transistor, $V_T$ and $V_{TH}$ represent threshold voltages of a bipolar transistor and a MOS transistor, respectively, k represents a current formula constant of a MOS transistor. Also, a current without a symbol ' and a current with a symbol ' represent currents before change and after change, respectively.

Applying formulae 5 and 6 to the formula 4, the following relation could be obtained.

[Formula 7]

$$V_T \ln\left(\frac{i_{1'}}{i_1}\right) = V_T \ln\left(\frac{i_{2'}}{i_2}\right)$$

[Formula 8]

$$\frac{1}{\sqrt{k_3}}(\sqrt{i_{3'}} - \sqrt{i_3}) = \frac{1}{\sqrt{k_3}}(\sqrt{i_{4'}} - \sqrt{i_4})$$

Here, subscripts 1,2,3,4 represent the first bipolar transistor Q1, the second bipolar transistor Q2, the first MOS transistor M3, the second MOS transistor M4, respectively.

If base current of the bipolar transistor is ignored, then $i_2=i_1$ and $i_4=i_3$. In order for the formulae 7 and 8 to be satisfied, respectively, a current constant k3 of the first MOS transistor M3 should equal a current constant $k_4$ of the second MOS transistor M4.

It should be noted that a current constant k is determined by ratio of channel width W to channel length L of a MOS transistor. Therefore, non-linearity of a transconductor is eliminated if size ratios of the first and the second MOS transistors M3 and M4 are made same.

A drain current i4 of the second MOS transistor is given by the following formula.

$$i_4 = k_4(V_C - V_{BE1} - V_{TH})^2 \quad \text{[Formula 9]}$$

As can be seen from the formula 9, by adjusting a size of the second MOS transistor M4, namely, a current constant k4, one can appropriately adjust a drain current of the second MOS transistor M4.

Figure 6:
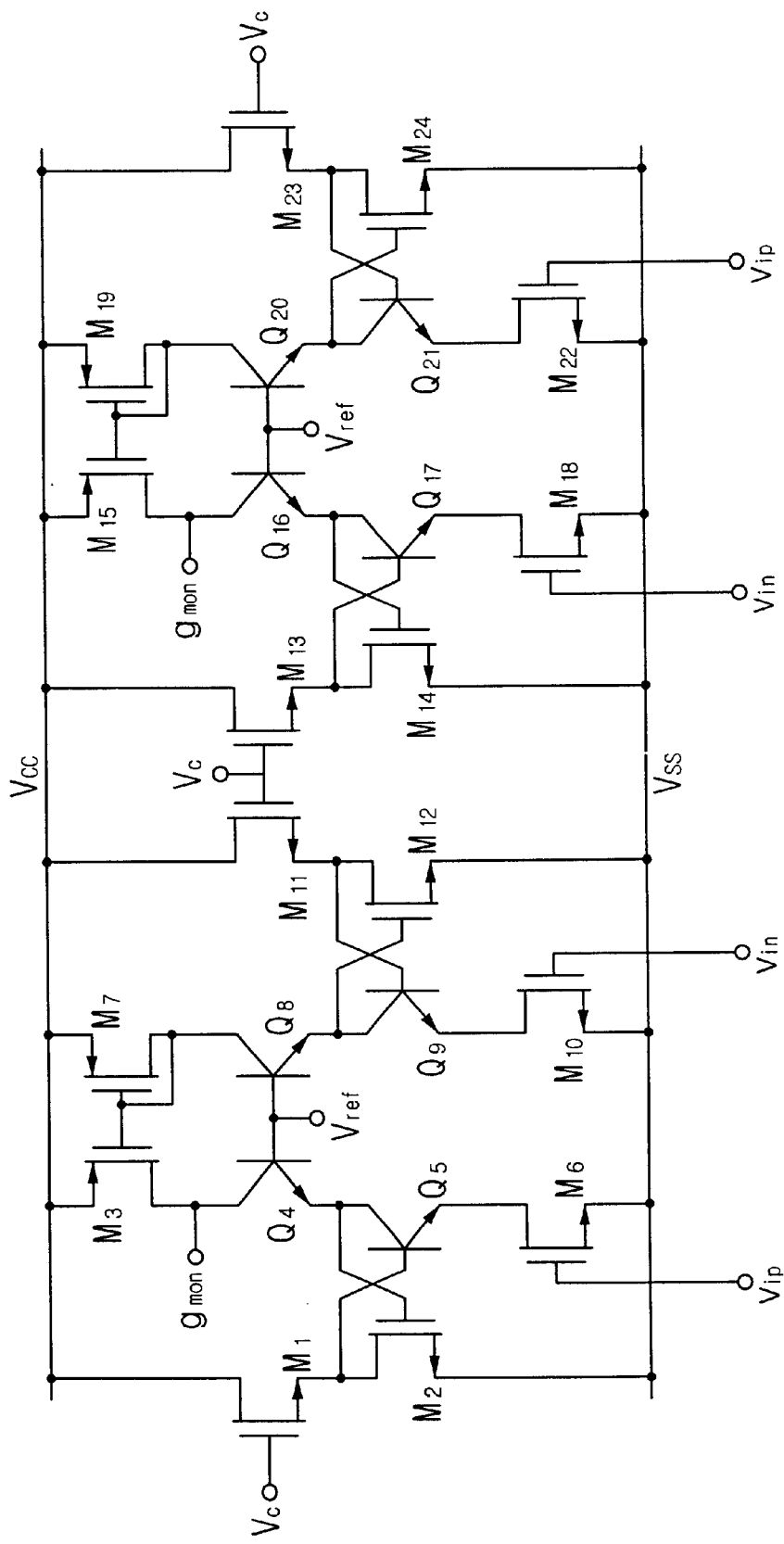
FIG. 6 is a circuit diagram representing a differential transconductor of common mode using a basic transconductor embodying the disclosed teachings.

FIG. 6 shows an example circuit that realizes a complete differential transconductor using self bias. It can be seen that this circuit uses several transconductors of FIG. 5.

As is apparent from FIG. 6, basic transconductor circuits of FIG. 5 are connected in parallel. Therefore, an output current corresponding to a difference (Vin–Vip) between input signals provided to a differential input terminal, is output through two output terminals $g_{mon}$ and $g_{mop}$.

In the circuit of FIG. 6, a power supply corresponding to the control power supply Vref+ΔV described in FIG. 5, is applied to a control power supply $V_C$.

Figure 7:
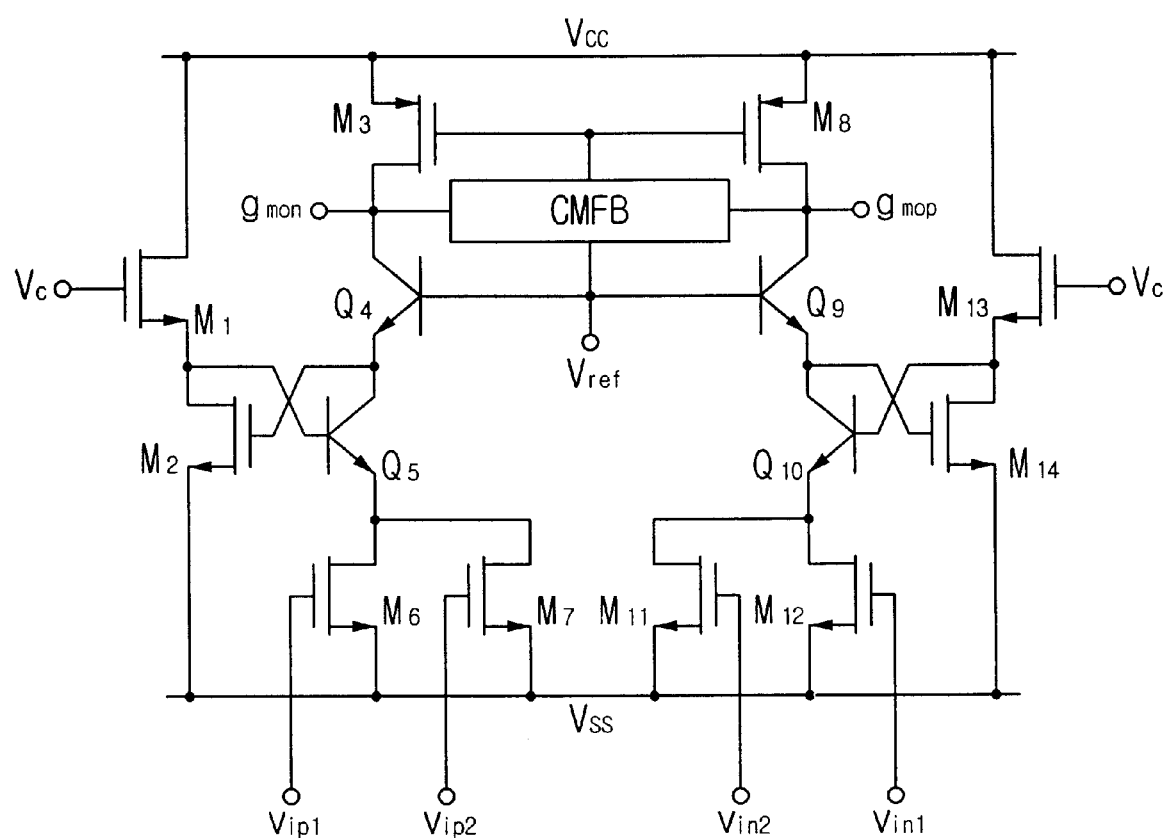
FIG. 7 is a circuit diagram representing a transconductor for multi-input using a basic transconductor embodying the disclosed teachings.

FIG. 7 shows an example of a transconductor based on the multi-input by a common-mode feedback(CMFB) method that is built using the basic transconductor of FIG. 5.

Figure 8:
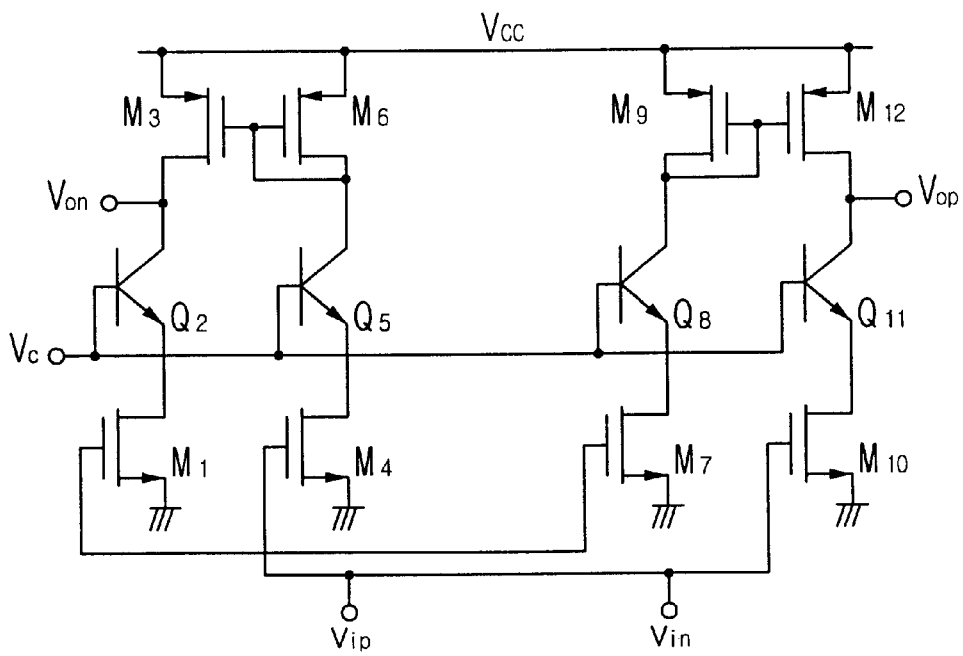
FIG. 8 is a circuit diagram representing a conventional transconductor provided to compare transconductance according to a size of an input signal, with a transconductor circuit of FIG. 6.
Figure 9:
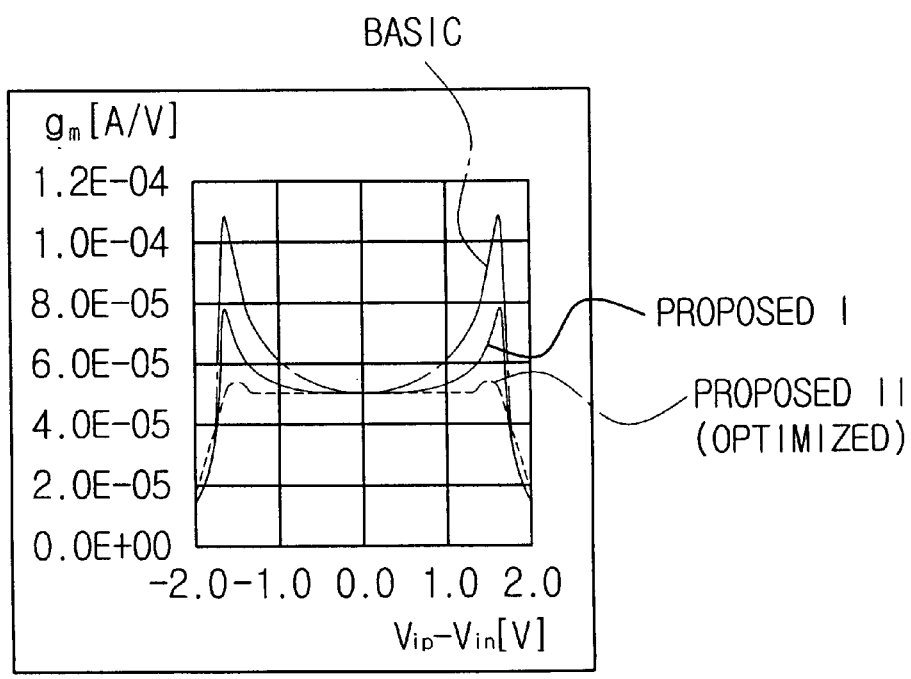
FIG. 9 is a graph comparing a transconductor circuit of FIG. 8, with transconductance according to a size of an input signal in a transconductor circuit of FIG. 6.

FIG. 9 shows a comparison of simulation results for transconductance values (based on size of input signal) for a differential transconductor circuit of FIG. 6 and another conventional transconductor circuit as shown in FIG. 8. In FIG. 9, a graph indicated by "Proposed I" stands for transconductance values of a circuit in FIG. 6, and a graph indicated by "Basic" stands for transconductance values of a circuit in FIG. 8. As you can see from FIG. 9, a transconductance circuit based on the teachings of this disclosure is better than the conventional transconductance. In this comparison, a change according to a size of an input signal is considered as a criteria for comparison.

However, an influence of an input signal is not completely eliminated. This is because of a channel length modulation factor of the MOS transistor. Therefore, if the size of a MOS transistor is changed, one can improve characteristics as shown in a graph indicated by "Proposed II". Such a change would involve changing channel length and width so that gate-source voltages of each of the MOS transistora are same.

As is apparent from the foregoing, a transconductor embodying the disclsoed teachings has low power dissipation, provides linearity and also provides a wide range of operation frequency.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A transconductor for generating a current corresponding to an input voltage, the transconductor having crossing pairs structure, said transconductor comprising:

a first and a second MOS (Metal-Oxide Semiconductor) transistors mutually connected in series to a voltage source;

a first bipolar transistor connected to a current source, a collector terminal of the first bipolar terminal being connected to an output current terminal, an emitter terminal of the first bipolar terminal being connected to a gate terminal of the second MOS transistor;

a second bipolar transistor connected in series to the first bipolar transistor, a base terminal of the second bipolar transistor being connected to a node between the first MOS transistor and the second MOS transistor; and a third MOS transistor, a gate terminal of the third MOS transistor being connected to an input terminal for a signal from outside, a drain terminal of the third MOS transistor being connected to an emitter terminal of the second bipolar transistor.

2. The transconductor according to claim 1, further comprising:

a reference bias voltage source provided to a base terminal of the first bipolar transistor; and a control voltage source applied to a gate terminal of the first MOS transistor for adjusting transconductance.

3. The transconductor according to claim 2, wherein the control voltage source is configured such that a voltage whose value is a sum of a voltage intended for being maintained between a gate and a source of the third MOS transistor and the reference bias voltage sources, is applied to a gate terminal of the first MOS transistor.

* * * * *